(12) United States Patent
Yee et al.

(10) Patent No.: US 6,175,482 B1
(45) Date of Patent: Jan. 16, 2001

(54) OUTPUT DRIVER DEVICE WITH ELECTROSTATIC DISCHARGE PROTECTION

(75) Inventors: Ah-Lyan Yee, Plano; Martin J. Izzard, Dallas; E. Ajith Amerasekepa, Plano, all of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/337,458

(22) Filed: Jun. 21, 1999

Related U.S. Application Data

(60) Provisional application No. 60/091,299, filed on Jun. 30, 1998.

(51) Int. Cl.$^7$ .................................................. H02H 3/22
(52) U.S. Cl. ........................... 361/111; 361/56; 361/91.1; 361/127; 361/118
(58) Field of Search .............................. 361/56, 118, 127, 361/111, 91.1

(56) References Cited

U.S. PATENT DOCUMENTS

| | | | |
|---|---|---|---|
| 4,734,752 | * 3/1988 | Liu et al. | 357/23.4 |
| 4,855,620 | * 8/1989 | Duvvury et al. | 307/448 |
| 5,028,819 | * 7/1991 | Wei et al. | 307/451 |

* cited by examiner

Primary Examiner—Stephen W. Jackson
Assistant Examiner—Sharon Polk
(74) Attorney, Agent, or Firm—J. Dennis Moore; Wade James Brady, III; Frederick J. Telecky, Jr.

(57) ABSTRACT

An output driver device (10) includes a first output transistor (12) and a second output transistor (14) coupled to a bias transistor (16). The bias transistor (16) is coupled to a ground potential. The first output transistor (12) is coupled to a first output pad (18) and the second output transistor (14) is coupled to a second output pad (20). The output driver device (10) has a direct non-metal path to ground potential from either the first output pad (18) or the second output pad (20). In this manner, an electrostatic discharge device on either the first output pad (18) or the second output pad (20) can be absorbed through the first output transistor (12) or the second output transistor (14), respectively, and through the bias transistor (16) without damaging the output driver device (10).

7 Claims, 1 Drawing Sheet

OUTPUT DRIVER DEVICE WITH ELECTROSTATIC DISCHARGE PROTECTION

This application claims priority under 35 USC § 119(e)(1) of provisional application no. 60/091,299, filed Jun. 30, 1998.

TECHNICAL FIELD OF THE INVENTION

The present invention relates in general to semiconductor devices and more particularly to an output driver device with electrostatic discharge protection.

BACKGROUND OF THE INVENTION

Conventional open drain differential output drivers are protected from failure due to electrostatic discharge by connecting the output node to a separate electrostatic discharge transistor. The electrostatic discharge transistor provides a path to ground from the output pad for an electrostatic discharge strike in order to avoid damage to the output driver. However, the output transistor providing the actual output must not only drive its drain load but also the load of the electrostatic discharge transistor. The additional load driven by the output transistor is detrimental to performance of the output driver, especially for a high speed input/output device operating at gigahertz speeds. Therefore, it is desirable to reduce the load driven by an output driver and enhance high speed performance while still providing electrostatic discharge protection.

SUMMARY OF THE INVENTION

From the foregoing, it may be appreciated that a need has arisen for an output driver device with a reduced load for enhanced high speed performance and with electrostatic discharge protection. In accordance with the present invention, an output driver device with electrostatic discharge protection is provided that substantially eliminates or reduces disadvantages and problems associated with conventional output driver devices with electrostatic discharge protection.

According to an embodiment of the present invention, there is provided an output driver device with electrostatic discharge protection that includes a first diffusion node formed into a substrate layer. The first diffusion node is coupled to a ground potential. A second diffusion node is formed in the substrate layer such that the first and second diffusion nodes form a bias transistor. A third diffusion node is formed in the substrate layer such that the second and third diffusion nodes form an output transistor. The third diffusion node is coupled to an output pad. The first, second, and third diffusion nodes form a non-metal path from the output pad to the ground potential to absorb an electrostatic discharge strike occurring on the output pad, protecting the output driver from damage.

The present invention provides various technical advantages over conventional output drivers with electrostatic discharge protection. For example, one technical advantage is in reducing the load driven by the output transistors in the output driver device. Another technical advantage is in reducing drain capacitance and layout area for the output driver device. Yet another technical advantage is in having the output driver also absorb any electrostatic discharge strike. Other technical advantages may be readily ascertained by those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
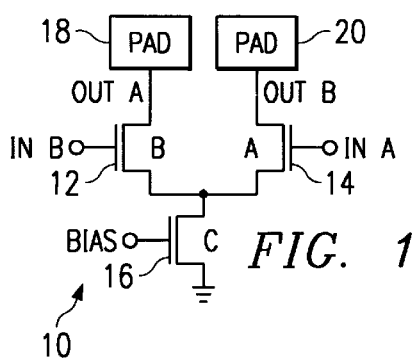
FIG. 1 illustrates a simplified schematic of an output driver device.

FIG. 1 is a simplified schematic of an output driver device 10. Output driver device 10 includes a first output transistor 12, a second output transistor 14, and a bias transistor 16. The first output transistor 12 and the second output transistor 14 have their sources coupled to the drain of bias transistor 16. The source of bias transistor 16 is coupled to a ground potential. The drain of first output transistor 12 is coupled to a first output pad 18. The drain of the second output transistor is coupled to a second output pad 20. A first input signal IN A drives the gate of second output transistor 14. A second input signal IN B drives the gate of first output transistor 12. A bias signal BIAS drives the gate of bias transistor 16. Through first output transistor 12 and second output transistor 14, output driver device 10 becomes an open drain differential output driver. Output driver device 10 has a direct path to ground to absorb an electrostatic discharge strike occurring on either first output pad 18 or second output pad 20 without damaging any of first output transistor 12, second output transistor 14, and bias transistor 16.

Figure 2:
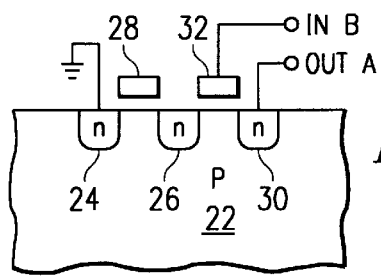
FIG. 2 illustrates a simplified sectional view of half of the output driver device.

FIG. 2 shows a simplified sectional view of one of many electrostatic discharge paths of output driver device 10. Though shown in an n-channel configuration, output driver device 10 may also be implemented in a p-channel configuration. Output driver device 10 is formed in a substrate layer 22. A first diffusion node 24 is formed within substrate layer 22. First diffusion node 24 is coupled to the ground potential. A second diffusion node 26 is formed in substrate layer 22 such that second diffusion node 26 and first diffusion node 24, in conjunction with a first gate node 28, form bias transistor 16. A third diffusion node 30 is formed in substrate layer 22 such that third diffusion node 30 and second diffusion node 26, in conjunction with a second gate node 32, form first output transistor 12 in a non-differential configuration. Second output transistor 14 may be formed in a similar manner to provide a differential output for output driver device 10. Third diffusion node 30 is coupled to first output pad 18. Formation of output driver 10 may occur through any conventional fabrication techniques and may be fabricated with substrate layer 22 having a p-type semiconductor material and first, second, and third diffusion nodes 24, 26, and 30 having an n-type semiconductor material.

Figure 3:
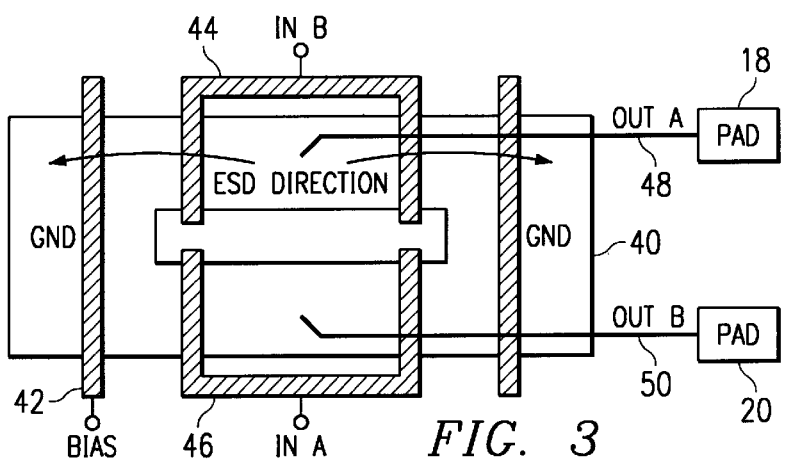
FIG. 3 illustrates a layout view of half of the output driver device.

FIG. 3 is a simplified layout view of output driver device 10. The layout of output driver device 10 includes a ground potential layer 40 and polysilicon layers 42, 44, and 46 for the gate inputs to bias transistor 16, first output transistor 12, and second output transistor 14. First output pad 18 is coupled to the drain of first output transistor 12 by a first metal lead 48. Second output pad 20 is coupled to the drain of second output transistor 14 by a second metal lead 50. An electrostatic discharge strike occurring on either first output pad 18 or second output pad 20 can be absorbed by output driver device 10 through a direct electrostatic discharge path to ground potential without being blocked by any metal leads as present in conventional output driver device layouts. By having a direct non-metal path to ground potential, an electrostatic discharge strike can pass through output driver device 10 without damaging first output transistor 12, second output transistor 14, and bias transistor 16.

Figure 4A:
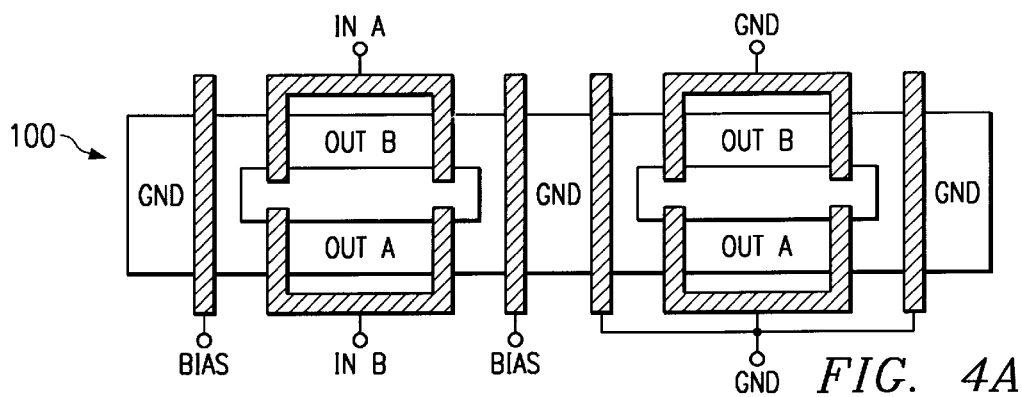
FIGS. 4A–B illustrate an output driver device with increased electrostatic discharge protection.
Figure 4B:
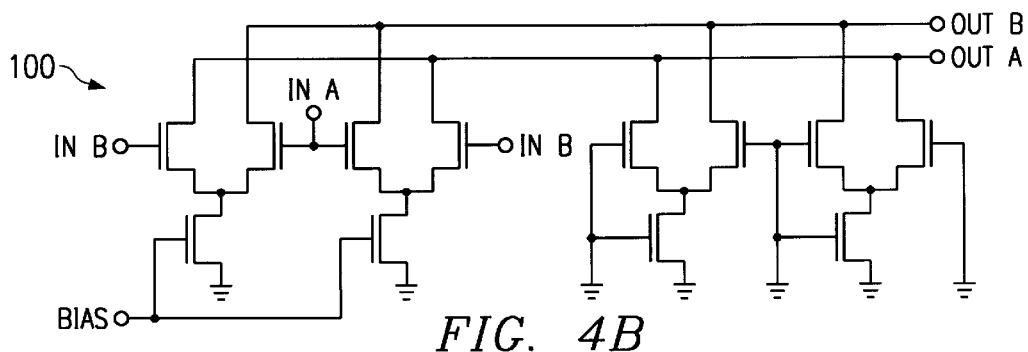

FIGS. 4A and 4B show an output driver device 100 with increased electrostatic discharge protection. FIG. 4A is a layout view of output driver device 100 and FIG. 4B is a schematic view of output driver device 100. The design for output driver device 100 is used for smaller open drain differential drivers where the parasitic bipolar may not be large enough to provide sufficient electrostatic discharge protection. The parasitic bipolar can be made larger by including additional devices to provide increased electrostatic discharge protection with only a slight increase to the load of output driver device 100.

Thus, it is apparent that there has been provided, in accordance with the present invention, an output driver device with electrostatic discharge protection that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A differential output driver circuit with electrostatic discharge protection, comprising:

a first transistor coupled to a first output pad;

a second transistor coupled to a second output pad;

a bias transistor coupled to the first and second transistors, the bias transistor providing a direct non-metal path to a ground potential from the first and second output pads to allow absorption of an electrostatic discharge strike on either of the first and second output pads.

2. The differential output driver circuit of claim 1, wherein the first, second, and bias transistors are n-channel transistor devices.

3. The differential output driver circuit of claim 1, wherein the first and second transistors have each of their sources coupled to a drain of the bias transistor.

4. The differential output driver circuit of claim 1, further comprising:

an additional electrostatic discharge circuit coupled to the first output pad and the second output pad, the additional electrostatic discharge circuit providing increased electrostatic discharge protection without significantly adding additional load to the first and second transistors.

5. The differential output driver circuit of claim 4, wherein the additional electrostatic discharge circuit provides the direct non-metal path to the ground potential to direct an electrostatic discharge strike on the first or second output pad away from the first and second transistors.

6. An output driver circuit, comprising:

a substrate layer;

a first diffusion node formed in the substrate layer, the first diffusion node coupled to a ground potential;

a second diffusion node formed in the substrate layer, the first and second diffusion nodes forming a bias transistor;

a third diffusion node formed in the substrate layer, the second and third diffusion nodes forming an output transistor, the third diffusion node coupled to an output pad, the first, second, and third diffusion nodes providing a non-metal path to the ground potential to allow for absorption of an electrostatic discharge strike occurring at the output pad.

7. The output driver of claim 2, wherein the substrate layer is formed of a p-type semiconductor material and the first, second, and third diffusion nodes are formed of an n-type semiconductor material.

* * * * *

UNITED STATES PATENT AND TRADEMARK OFFICE
CERTIFICATE OF CORRECTION

| | | |
|---|---|---|
| PATENT NO. | : 6,175,482 B1 | Page 1 of 1 |
| DATED | : January 16, 2001 | |
| INVENTOR(S) | : Ah-Lyan Yee, Martin J. Izzard, E. Ajith Amerasekera | |

It is certified that error appears in the above-identified patent and that said Letters Patent is hereby corrected as shown below:

Inventor's name should read as follows:
E. Ajith Amerasekera

Signed and Sealed this

Tenth Day of July, 2001

*Attest:*

*Attesting Officer*

NICHOLAS P. GODICI
*Acting Director of the United States Patent and Trademark Office*